United States Patent
Armacost et al.

(10) Patent No.: US 11,889,639 B2
(45) Date of Patent: Jan. 30, 2024

(54) POWER ROUTING MODULE WITH PORTS

(71) Applicant: Peterson Manufacturing Company, Grandview, MO (US)

(72) Inventors: David S. Armacost, Leawood, KS (US); Cory D. Adams, Raymore, MO (US)

(73) Assignee: Peterson Manufacturing Company, Grandview, MO (US)

( * ) Notice: Subject to any disclaimer, the term of this patent is extended or adjusted under 35 U.S.C. 154(b) by 289 days.

(21) Appl. No.: 17/077,637

(22) Filed: Oct. 22, 2020

(65) Prior Publication Data
US 2022/0132685 A1     Apr. 28, 2022

(51) Int. Cl.
*F21V 23/06*     (2006.01)
*H01R 25/00*     (2006.01)
(Continued)

(52) U.S. Cl.
CPC ........... *H05K 5/0069* (2013.01); *F21V 23/06* (2013.01); *H01R 25/006* (2013.01); *H01R 27/02* (2013.01);
(Continued)

(58) Field of Classification Search
CPC ..... B60K 2370/46; B60K 35/00; F21V 23/06; H01R 12/7076; H01R 13/5213; H01R 13/6272; H01R 13/73; H01R 25/006; H01R 25/00; H01R 27/02; H01R 2201/26; H01R 13/04; H01R 13/10; H01R 13/114; H01R 13/20; H01R 13/62922; H05K 5/0069; H05K 5/0217; H05K 5/0247; H05K 5/0252; H05K 5/03; H05K 5/00; H05K 5/02; H05K 5/0026; H05K 5/04; H05K 7/1432; H05K 7/14329; H05K 7/2039
(Continued)

(56) References Cited

U.S. PATENT DOCUMENTS

| 4,781,600 A | 11/1988 | Sugiyama et al. |
| 5,622,506 A | 4/1997 | Homig et al. |

(Continued)

FOREIGN PATENT DOCUMENTS

WO     2018001612 A1     1/2018

OTHER PUBLICATIONS

International Patent Application No. PCT/US21/56288 "International Search Report and Written Opinion" dated Jan. 25, 2022, 11 pages.

*Primary Examiner* — Timothy J Thompson
*Assistant Examiner* — Guillermo J Egoavil
(74) *Attorney, Agent, or Firm* — Polsinelli PC; Adam C. Rehm

(57) ABSTRACT

A circuit board cover having a housing having a first surface, a perimeter edge, a housing cavity partially defined by the first surface and the perimeter edge, a skirt extending from the perimeter edge away from the first surface in a first direction to partially define the housing cavity, and a plurality of ports disposed on the first surface. The housing cavity can be operable to house a printed circuit board. Each of the plurality of ports can include (i) a sidewall extending away from the first surface in a second direction opposite to the first direction, (ii) a port cavity partially defined by the sidewall, and (iii) one or more terminals disposed at least partially within the port cavity.

20 Claims, 6 Drawing Sheets

(51) Int. Cl.
*H01R 27/02* (2006.01)
*H05K 5/00* (2006.01)
*H05K 5/02* (2006.01)
*H05K 5/03* (2006.01)
*H01R 13/52* (2006.01)
*H01R 13/627* (2006.01)
*H01R 13/73* (2006.01)

(52) U.S. Cl.
CPC ......... *H05K 5/0217* (2013.01); *H05K 5/0247* (2013.01); *H05K 5/0252* (2013.01); *H05K 5/03* (2013.01); *H01R 13/5213* (2013.01); *H01R 13/6272* (2013.01); *H01R 13/73* (2013.01); *H01R 2201/26* (2013.01)

(58) Field of Classification Search
USPC ........................................ 361/679.01; 174/59
See application file for complete search history.

(56) References Cited

U.S. PATENT DOCUMENTS

| | | |
|---|---|---|
| 2008/0048496 A1 | 2/2008 | Fisher et al. |
| 2010/0018742 A1* | 1/2010 | Lubanski ............... H02G 9/025 |
| | | 174/97 |
| 2015/0092432 A1 | 4/2015 | Arita et al. |
| 2015/0245503 A1* | 8/2015 | Hansen ................. H01R 13/10 |
| | | 174/59 |
| 2016/0118757 A1* | 4/2016 | Kleinke ................ H01R 25/00 |
| | | 439/620.21 |
| 2018/0219313 A1* | 8/2018 | Sauer ................... H01R 12/716 |

* cited by examiner

POWER ROUTING MODULE WITH PORTS

TECHNICAL FIELD

The present technology relates to a circuit board cover and, more particularly, to a circuit board cover configured to simultaneously house and protect a circuit board and facilitate connection of plugs thereto.

BACKGROUND

Vehicles now have many different lights on various areas of the vehicle. Additionally, vehicle attachments, such as trailers, also contain additional sets of lights. These lights all require wiring to operate safely and properly. With many sets of lights, users can easily confuse each set of wires and its respective sets of lights. Conventional vehicles include these lights pre-assembled for consumers. However, consumers may desire to attach vehicle attachments, such as trailers, that also require lights. Likewise, consumers may need to replace lights after driving their vehicle for extended periods of time.

SUMMARY

In one aspect, a circuit board cover can have a housing having a first surface, a perimeter edge, and a housing cavity partially defined by the first surface and the perimeter edge, a skirt extending from the perimeter edge away from the first surface in a first direction to partially define the housing cavity, the housing cavity operable to house a printed circuit board, and a plurality of ports disposed on the first surface, each of the plurality of ports including (i) a sidewall extending away from the first surface in a second direction opposite to the first direction, (ii) a port cavity partially defined by the sidewall, and (iii) one or more terminals disposed at least partially within the port cavity.

In another aspect, the first surface can include a first section and a second section, such that the first section includes a first subset of the plurality of ports configured to receive a plug for a main set of lights, and the second section includes a second subset of the plurality of ports configured to receive a second plug for a second set of lights.

In another aspect, the one or more terminals are molded into the circuit board cover and configured to provide an electrical connection with the printed circuit board.

In another aspect, the printed circuit board is mounted within the housing cavity and configured to receive electricity via a vehicle power source and route the electricity via the electrical connection provided by the one or more terminals through the port cavity.

In another aspect, the circuit board cover can further include a plug releasably secured to at least one of the plurality of ports, such that the electricity is communicated through the electrical connection to the plug.

In another aspect, the circuit board cover can further include indicia disposed on the skirt for designating a first subset of the plurality of ports for a first use and a second subset of the plurality of ports for a second use.

In another aspect, the circuit board cover can further include a plurality of mounting flaps protruding from the skirt in a third direction, each of the plurality of mounting flaps including a receiver operable to receive a mounting component and enable securing of the circuit board cover to a vehicle body, wherein the third direction is orthogonal to the first direction and the second direction.

In another aspect, the first surface can include a first half and a second half, and wherein a first subset of the plurality of ports are disposed on the first half and a second subset of the plurality of ports are disposed the second half, and wherein the first subset and the second subset are different ports.

BRIEF DESCRIPTION OF THE DRAWINGS

The above-recited and other advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

Figure 1:
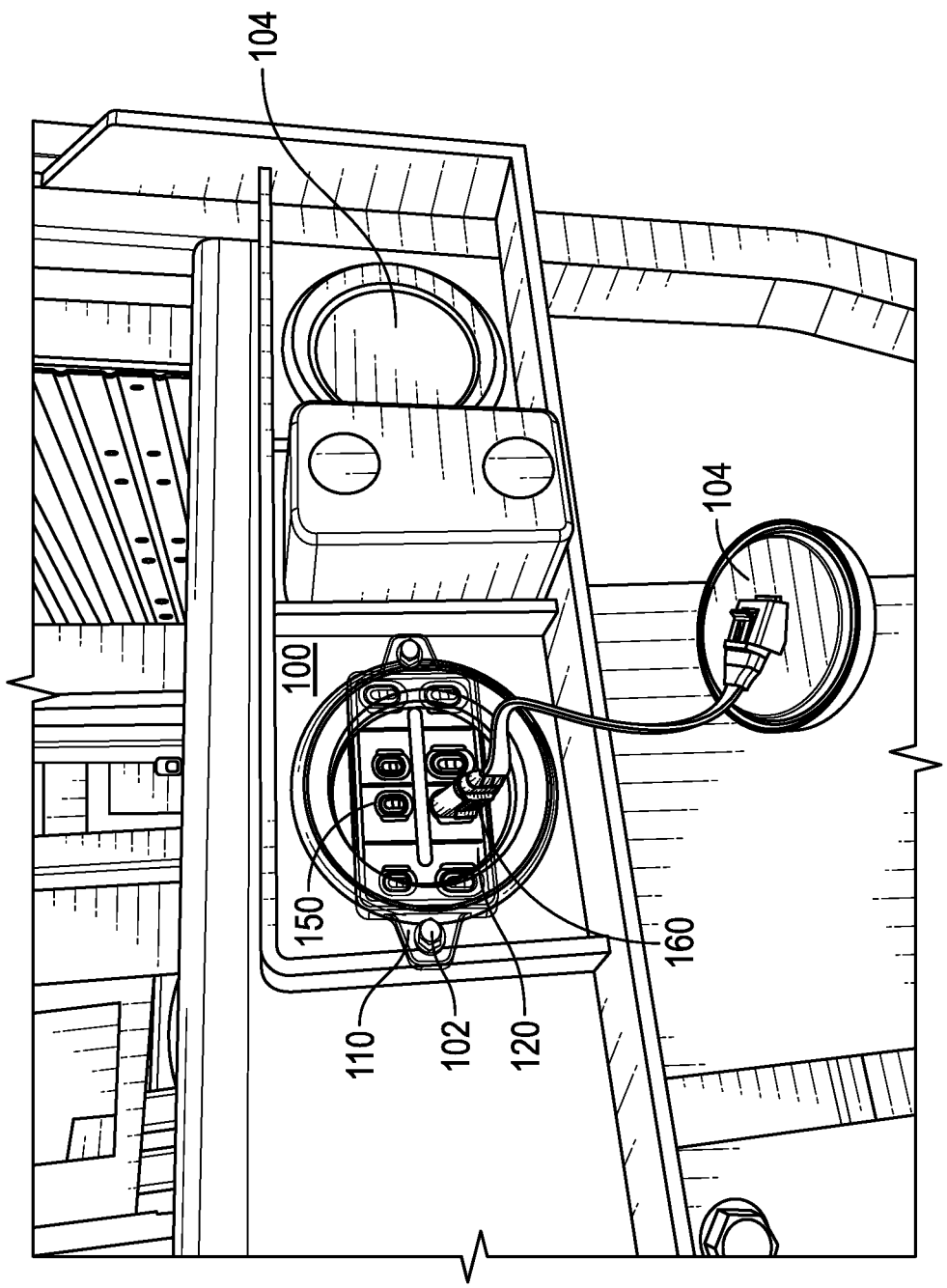
FIG. 1 shows an example environment having a circuit board cover mounted to a portion of a vehicle.
Figure 2:
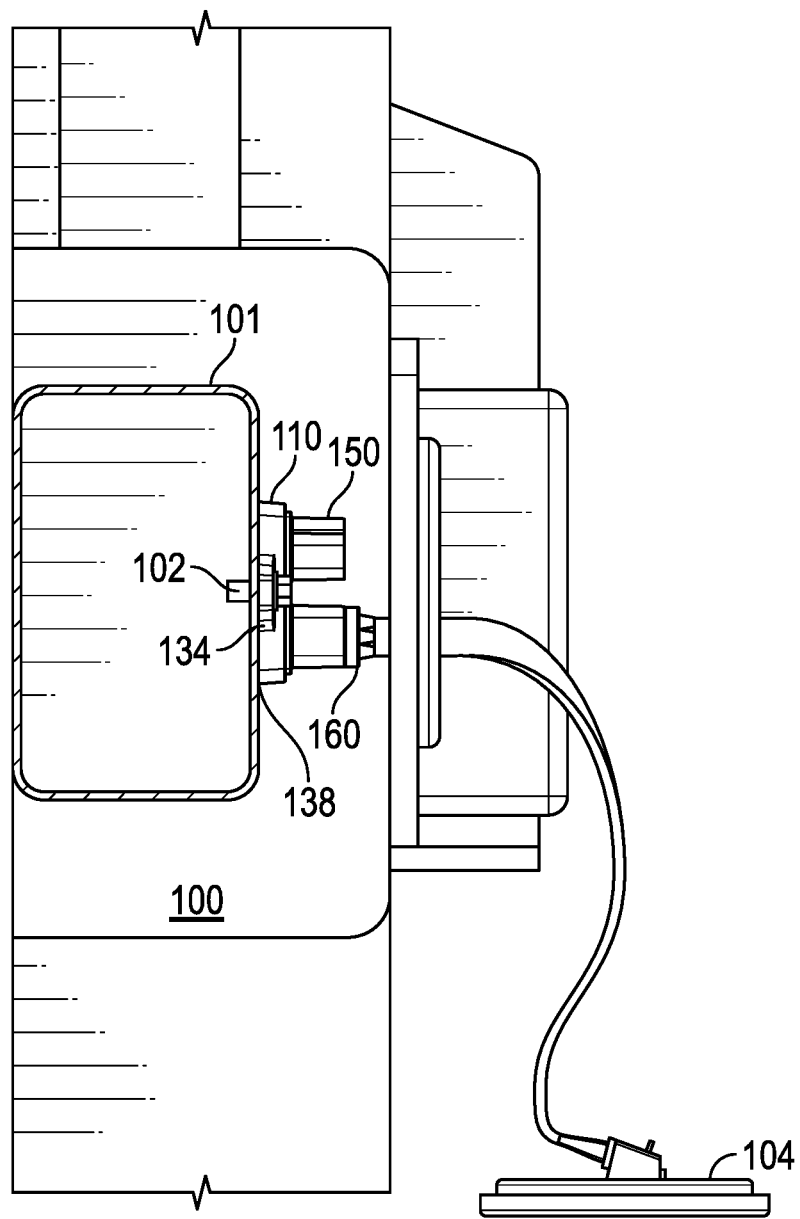
FIG. 2 shows an example environment having a circuit board cover mounted to a portion of a vehicle.

Turning now to the figures, FIGS. 1 and 2 illustrate an example environment having a circuit board cover 110 mounted (e.g., via fasteners 102) to a portion 101 of a vehicle 100 (e.g., a trailer of a vehicle). Circuit board cover 110 can house a circuit board (obscured from view in FIG. 1 and better shown in FIG. 3) and secure the circuit board to vehicle 100. Circuit board cover 110 can be mounted to mounting plates, a mounting area, vehicle abutment surface, or any portion 101 of vehicle 100 to provide securement by creating a seal. For example, circuit board cover 110 can be mounted to an inside panel of vehicle 100, such as part of a trunk of the vehicle. As another example, circuit board cover 110 can be mounted to an outside of vehicle 100, such that a plurality of ports 150 on a first surface 120 are easily accessible. In other words, circuit board cover 110 can be operable to be a circuit board cover, a circuit board protector, power routing module, and/or a breakout module for the circuit board. As will be discussed further below, a lower abutment surface 138 of circuit board cover 110 can, in some embodiments, provide a seal by abutting against a vehicle abutment surface 101 or any portion 101 of vehicle 100, such that the seal protects the circuit board from dust, dirt, water, etc. Additionally, circuit board cover 110 can be configured to provide an electrical connection between the circuit board and the plurality of ports 150 on circuit board cover 110. The plurality of ports 150 can interface with one or more plugs 160 that provide power to one or more lights 104 for vehicle 100.

A plurality of mounting flaps 134 can extend or protrude from skirt 132 in a third direction. The third direction can be orthogonal to both the first direction and the second direction. Each mounting flap 134 can include a receiving aperture 136 (better shown in FIGS. 3-5) operable to receive fasteners 102 (e.g., a screw or bolt) and enable or facilitate securing of circuit board cover 110 (e.g., to a portion of vehicle 100). As shown better shown in FIGS. 3-5 receiving apertures 136 may also be slots, such that the slots provide a range of motion along the slot. In some embodiments, the slots may be in different directions. For example, as shown, one slot has a length along a longer axis of circuit board cover 110, while another slot has a length along a shorter axis of circuit board cover 110. By utilizing slots in different directions, circuit board cover 110 can be mounted (e.g., to a portion of vehicle 100) more easily and with more degrees of freedom along the axes of the slots.

FIG. 2 illustrates circuit board cover 110 mounted to portion 101 of vehicle 100. More specifically, circuit board cover 110 can, when installed, be positioned behind light 104. In other words, circuit board cover 110 can be installed in locations of vehicle 100, such that circuit board cover 110 is obscured from view when installed. However it is to be understood, that circuit board cover 110 can also be installed in any portion 101 of vehicle 100.

Figure 3:
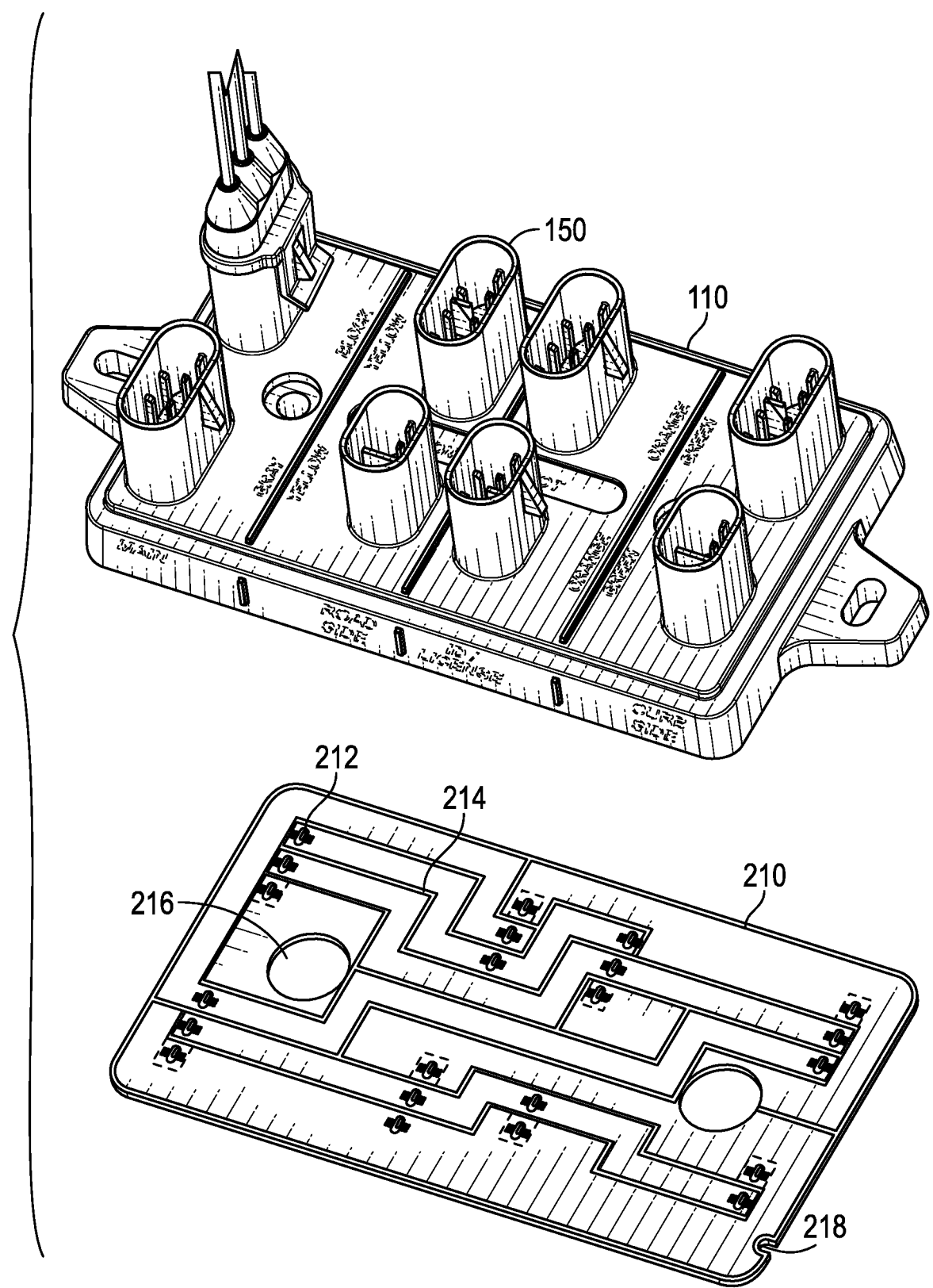
FIG. 3 shows a top isometric exploded view of a circuit board cover and a circuit board.

FIG. 3 illustrates an exploded view of circuit board cover 110 and circuit board 210. As discussed briefly above, circuit board cover 110 can be operable to house circuit board 210. Furthermore, circuit board cover 110 can be operable to provide an electrical connection from components 212 of circuit board cover 110 through a plurality of ports 150 of circuit board cover 110. As shown in FIG. 2, in some embodiments, circuit board cover 110 can manufactured to be generally planar and/or substantially similar in shape and size to circuit board 210. It is to be understood, however, that circuit board cover 110 can be created in any general shape and/or size operable to house circuit board 210.

Circuit board 210 can have components 212 and tracks 214. Additionally, circuit board 210 can include through-hole technology, surface-mount technology, and/or any combination thereof.

Components 212 can be operable to interface with terminals (e.g., terminals 156) to communicate electricity and/or electrical currents therethrough. For example, components 212 can be endpoint of a track 214. As another example, component 212 can be a through-hole that can interface with a terminal (not shown).

Circuit board 210 can also have a non-conductive area 216 for accommodating stabilizing features (e.g., stabilizing features 170 discussed below). Non-conductive area 216 can be operable to provide an area to receive stabilizing features to reduce movement of circuit board 210. In some embodiments, the non-conductive area may be an aperture configured to receive mounting fasteners and/or stabilizing features 170 therethrough.

Circuit board 210 can also have a notch 218. Notch 218 is operable to receive a protrusion (e.g., ridge 172) to reduce movement of circuit board 210 when circuit board 210 is disposed within circuit board cover 110.

Circuit board 210 is operable to receive electricity from a power source (e.g., a vehicle power source, car battery, etc.). Additionally, circuit board 210 can route the electricity from, to, and/or through terminals 156 (e.g., via an electrical connection provided by terminals 156). For example, at least one of ports 150 can receive incoming power from the vehicle and provide electricity through terminals 156, such that circuit board 210 can receive the electricity from the power source through terminals 156, when circuit board 210 is installed in circuit board cover 110. Additionally, at least one other of ports 150 can send power from circuit board 210 to plug 160 of lights 104.

Figure 4:
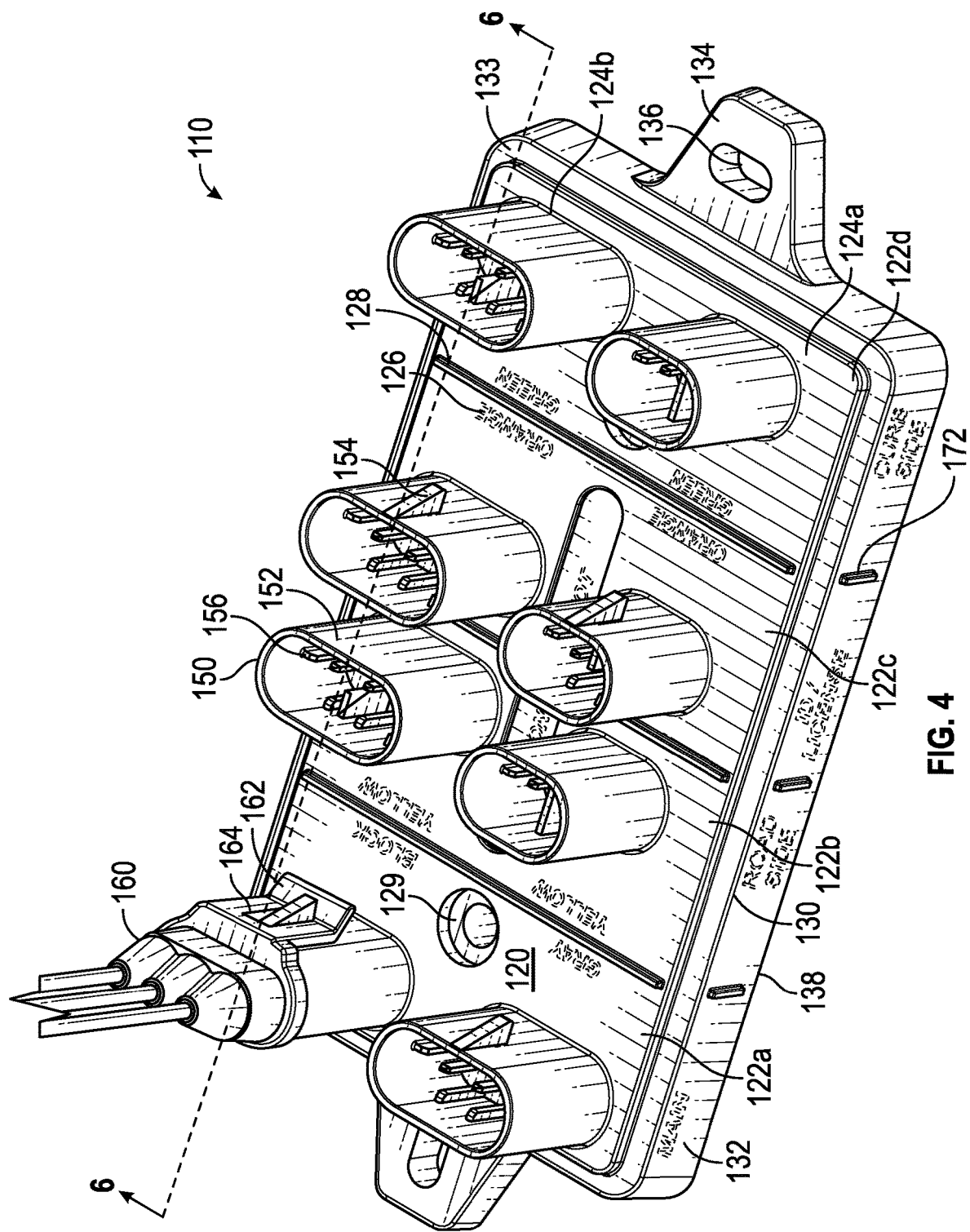
FIG. 4 shows a top isometric assembled view of a circuit board cover and a circuit board.

FIG. 4 illustrates a circuit board cover assembly and, more specifically, circuit board 210 housed within circuit board cover 110. Circuit board cover 110 can be constructed to have a first surface 120, a perimeter edge 130, a skirt 132, a housing cavity 140 (shown in FIG. 5), and a plurality of ports 150.

First surface 120 can be divided into one or more sections 122a, 122b, 122c, 122d (collectively sections 122) on first surface 120. Similarly, first surface 120 can also be divided into one or more halves 124a, 124b (collectively halves 124) on first surface 120.

Sections 122 and halves 124 can be defined on first surface 120, such that each section 122 and/or half 124 has one or more ports 150. For example, first half 124a may have a first subset of ports 150, while second half 124b has a second subset of ports 150. Furthermore, the first subset of ports 150 and the second subset of ports 150 can have different ports, such that ports 150 of first half 124a can accommodate different plugs than ports 150 of second half 124b. Similarly, sections 122 can be configured to receive plugs for different sets of lights. For example, first section 122a can have ports configured to receive a plug for a main set of lights, while second section 124a can have ports configured to receive a plug for a second set of lights (e.g., road side lights, rear lights, etc.).

First surface 120 can also have indicia 126. Indicia 126 can be used to label and/or designate ports 150, sections 122, and/or halves 124 for specific uses. For example, FIG. 4 illustrates indicia 126 that labels each individual port in each section 122 and on each half 124. As further illustrated in FIG. 4, indicia 126 designates some ports as for black or gray lights, while designating other ports for orange or green lights. It is further contemplated that indicia 126 can be displayed or placed on a skirt 132. For example, as further illustrated in FIG. 4, indicia 126 designates sections 122 having subsets of ports 150 as being used for main, road side, ID/license, or curb side. However, it is to be understood that other uses can be utilized and that the depicted uses and indicia are for explanatory purposes only.

First surface 120 can also have structural ribs 128. Structural ribs 128 can provide additional structural support to circuit board cover 110. For example, structural ribs 128 can be laterally across (e.g., along a shorter axis of first surface 120) circuit board cover 110 to provide additional lateral support to circuit board cover 110. Although not shown, it is further contemplated that structural ribs 128 can be longitudinally along (e.g., along a longer axis of first surface 120) to provide additional longitudinal support to circuit board cover 110. It is also contemplated that structural ribs 128 can be diagonally across circuit board cover 110 to provide both latitudinal and longitudinal support to circuit board cover 110.

First surface 120 can also have one or more annular shoulders 129. Annular shoulders 129 can be operable to provide flex to one or more stabilizing features 170. For example, as circuit board cover 110 is secured to vehicle 100, stabilizing features 170 may be forced against circuit board 210. Excess force against circuit board 210 may cause circuit board 210 to break. Accordingly, annular shoulders 129 provide flex to prevent stabilizing features 170 from applying excessive force against circuit board 210.

Circuit board cover 110 can have a perimeter edge 130 defined around a periphery of first surface 120. Skirt 132 can extend from perimeter edge 130 away from first surface 120 in a first direction to partially define housing cavity 140.

Skirt 132 may also have a shoulder 133. Shoulder 133 may be circumferentially around first surface 120. Shoulder 133 can be operable to provide flex to skirt 132. For example, as circuit board cover 110 is secured to vehicle 100, shoulder 133 provides flex to allow skirt 132 to create a tight seal between lower abutment surface 138 and portion 101 of vehicle 100 as shown in FIG. 2.

Ports 150 are configured to provide an electrical connection between circuit board 210 and one or more plugs 160 in communication with ports 150. Additionally, ports 150 can be constructed to have a sidewall 152 and one or more terminals 156.

Sidewall 152 can is operable to receive and secure plug 160. As shown in FIG. 3, sidewall 152 can extend away from first surface 120 in a second direction, which may be opposite to the first direction. In some embodiments, sidewall 152 can be operable in shape to a cross-section of a capsule to accommodate plug 160. However, it is to be understood that sidewall 152 can be constructed in any shape and/or size to receive and secure plug 160, which may similarly have a wide variety of shapes and/or sizes. Furthermore, sidewall 152 can have a shape and/or size substantially similar to plug 160 to provide a friction fit securement.

Sidewall 152 can also have port ribs 153 operable to provide structural support to sidewall 152 and port 150. More specifically, port ribs 153 can provide both and horizontal structural support.

Sidewall 152 can also have a protrusion 154 configured to facilitate securement of plug 160. More specifically, protrusion 154 can be operable to provide a securing mechanism that removably secures plug 160. For example, protrusion 154 can be configured to be generally triangular prism in shape, such that a thicker end of protrusion 154 extends away from a distal end of sidewall 152 with respect to first surface 120. In other words, protrusion 154 can receive and secure a tab 162 with an aperture 164 on plug 160, such that tab 162 may flex away from sidewall 152 until protrusion 154 fits into aperture 164 as plug 160 is attached onto port 150. To remove plug 160, a user may pull on tab 162 to guide aperture 164 of tab 162 over the thicker end of protrusion 154 and pull tab 162 and/or plug 160 away from port 150. It is to be understood that other securing mechanisms may be used, alternatively or additionally, to protrusion 154 including, but not limited to, latches, threads, fasteners, etc. Similarly, one of ordinary skill in the art would understand that male and/or female parts of the securing mechanisms (e.g., protrusion and aperture) may be constructed on either sidewall 152 or plug 160.

Terminals 156 are operable to provide electrical connections therethrough. Terminals 156 can extend away from first surface 120 in the second direction. Similarly, terminals 156 can be substantially parallel to sidewalls 152. Each port 150 can be configured to have any number of terminals 156. For example, some ports 150 (e.g., ports 150 on half 124*b*) may have more terminals 156 than other ports 150 (e.g., ports 150 on half 124*a*). In some embodiments, terminals 156 can be molded onto and/or through first surface 120. It is further contemplated that terminals 156 can be constructed onto first surface 120 through other methods of manufacture including, but not limited to, co-molding, extrusion, casting, etc. Additionally, terminals 156 can be constructed using a variety of different metals and/or alloys to provide a desired amount of current flow therethrough.

Figure 5:
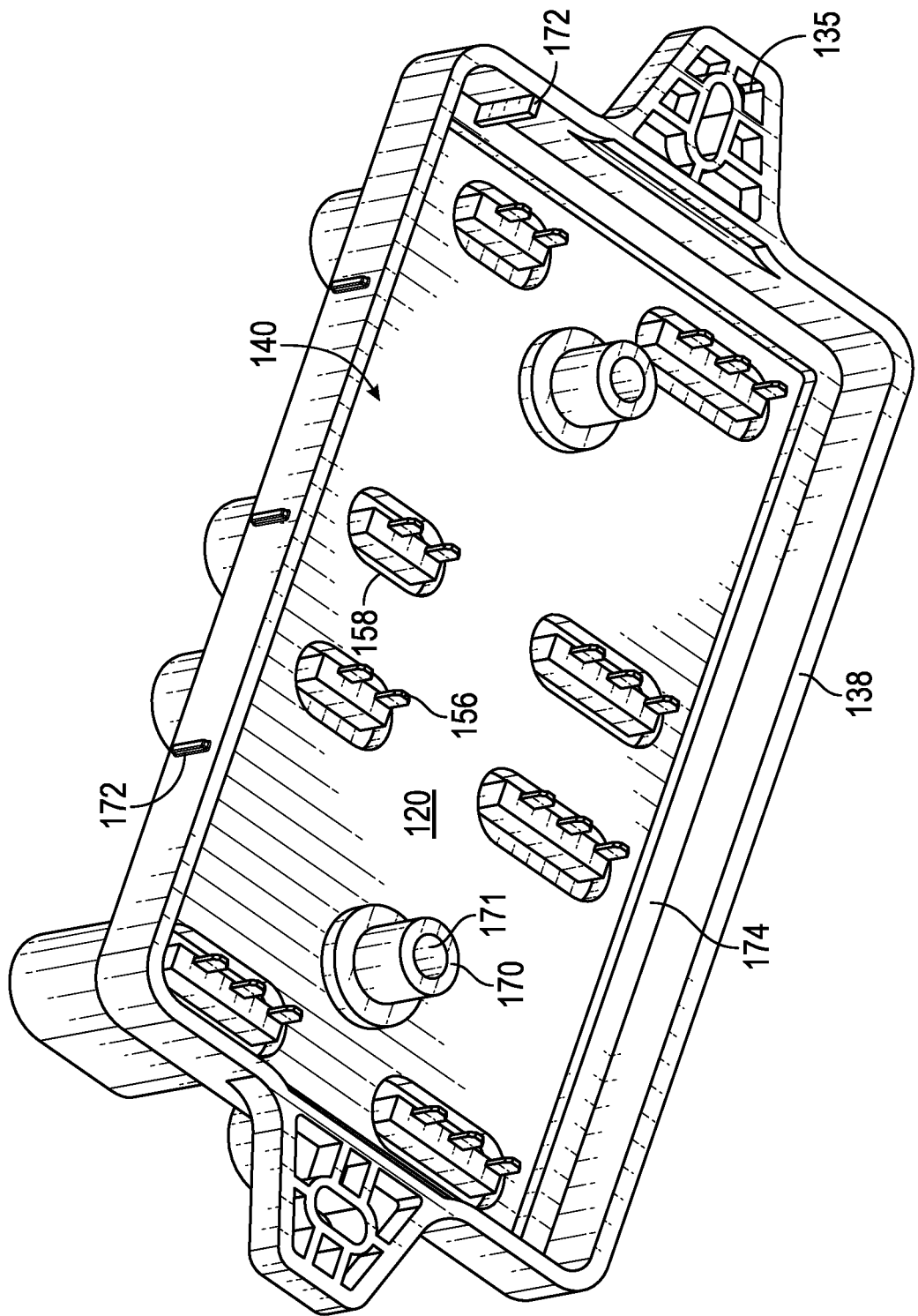
FIG. 5 shows a perspective bottom view of a circuit board cover.

FIG. 5 illustrates a perspective bottom view of circuit board cover 110. As discussed briefly above, circuit board cover 110 may have first surface 120 and skirt 132. First surface 120 and skirt 132 can partially define housing cavity 140. Housing cavity 140 is operable to house circuit board 210.

Additionally, circuit board cover 110 can have stabilizing features 170 that extend from the first surface in the first direction. In other words, the stabilizing features 170 may extend from the first surface and inward towards the housing cavity 140. Stabilizing features 170 can provide additional structural support to circuit board cover 110, while also reducing movement of circuit board 210, which may be housed within housing cavity 140. More specifically, stabilizing features 170 can be operable to prevent excess movement of circuit board 210 (e.g., along an axis defined by the first and second direction) when circuit board 210 is disposed within circuit board cover 110.

Stabilizing features 170 may also have an opening 171. Opening 171 can be used to receive additional fasteners to mount circuit board cover 110 to vehicle 100.

Circuit board cover 110 may also have ridges 172 that extend inwards from sidewall 152 into housing cavity 140. Like stabilizing features 170, ridges 172 can provide additional structural support to circuit board cover 110, while also reducing movement of circuit board 210. For example, ridges 172 can provide lateral support and reduce lateral movement of circuit board 210 when circuit board 210 is housed within housing cavity 140 of circuit board cover 110. Additionally, ridges 172 can act as a key to notch 218, as discussed above.

Housing cavity 140 may also be partially defined by shoulder surface 174. Shoulder surface 174 may be constructed recessed inward from first surface 120 to prevent excess contact between circuit board 210 and first surface 120.

First surface 120 may also have recesses 158 around terminals 156. Recesses 158 can reduce a surface area of first surface 120 that may come in contact with circuit board 210. Thus, recesses 158 can assist in maintaining optimal current from circuit board 210 through terminals 156. Additionally, recesses 158 can reduce a total amount of material used to manufacture circuit board cover 110.

Mounting portions 134 may also have a skeleton structure 135. Skeleton structure 135 provides both structural support and flex to mounting portions 134 to facilitate strong securement between mounting portions 134 and portion 101 of vehicle 100.

As discussed briefly above, circuit board cover 110 may also have a lower abutment surface 138. Lower abutment surface 138 can provide a seal between circuit board cover 110 and a portion of vehicle 100 around housing cavity 140 (e.g., as shown in FIG. 2.). Accordingly, housing cavity 140 and circuit board 210 housed therein can be protected by the seal provided between lower abutment surface 138 and vehicle 100. In some embodiments, the seal can be waterproof and weatherproof by virtue of a material of the lower abutment surface 138. In some embodiments, the material of the lower abutment surface 138 may be the same as or different from a material of circuit board cover 110.

Figure 6:
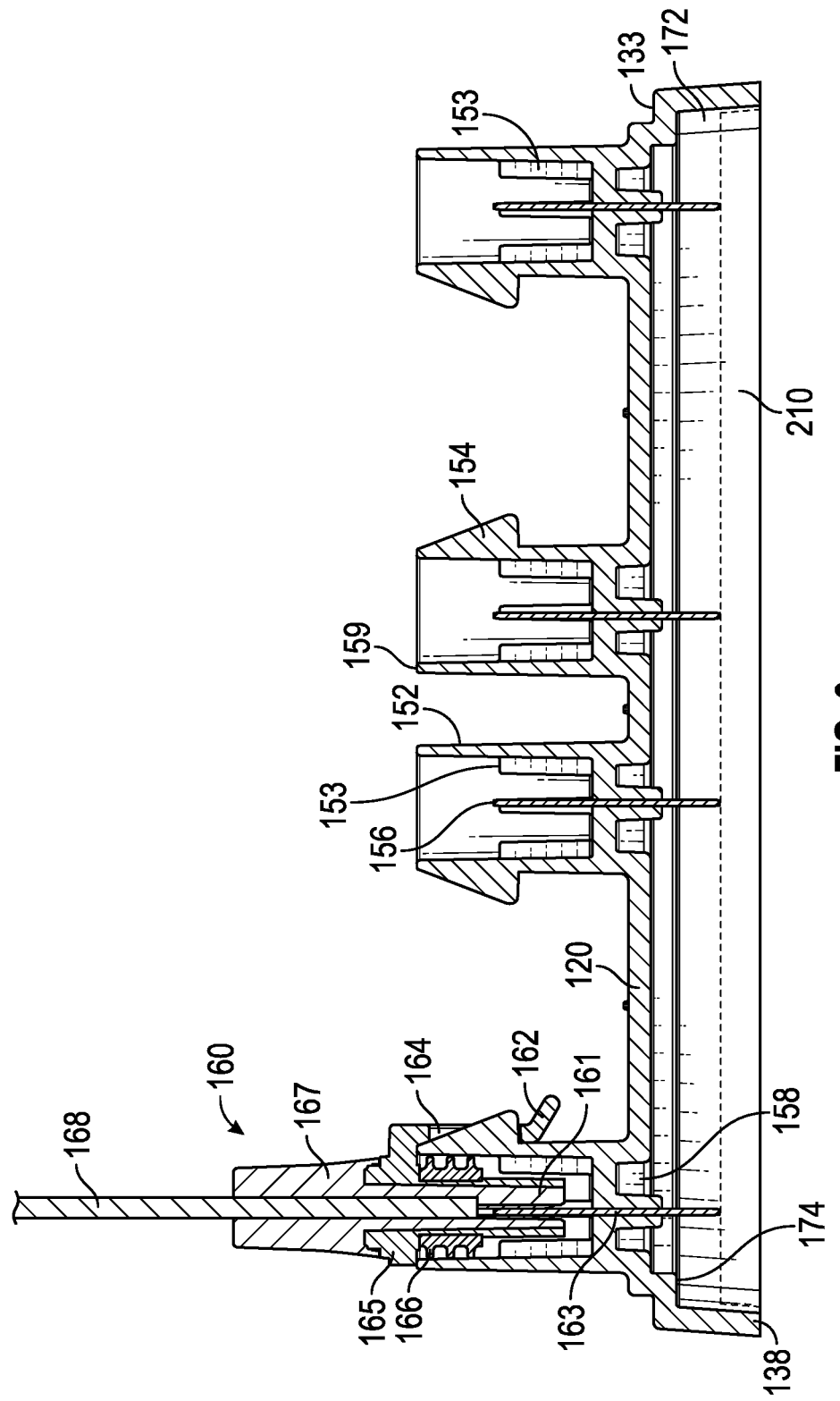
FIG. 6 shows a cross-sectional view of the circuit board cover of FIG. 4 along cross-section line 6-6.

FIG. 6 illustrates a cross-section of circuit board cover 110 along cross-section line 6-6.

As discussed above, circuit board cover 110 can have ports 150, having sidewalls 152, protrusion 154, and terminals 156. Plug 160 can attach to and be secured by ports 150. More specifically, the attachment between port 150 and plug 160 can be a friction fit attachment between sidewall 152 and plug 160. Additionally, aperture 164 of tab 162 fits over protrusion 154, such that plug 160 is releasably secured to port 150. In other words, protrusion 154 secures, via aperture 164, tab 162, and tab 162 can be released from protrusion 154 by pulling tab 162 away from protrusion 154 and lifting away from circuit board cover 110.

Additionally, in some embodiments, plug 160 can include a hardshell connector 165, ribs 166, and an insulator 167.

Hardshell connector 165 can interface with a port abutment surface 159. Hardshell connector 165 can be operable to abut against port abutment surface 159. Port abutment surface 159 and hardshell connector 165 provide stability to the connection between port 150 and plug 160. Furthermore, a height of sidewall 152, port abutment surface 159, and hardshell connector 165 can be configured to prevent a lower end of hardshell connector 165 from reaching a bottom of port 150. Similarly, these elements can be adjusted to configure any desired distance between hardshell connector 165 and the bottom of port 150. Furthermore, hardshell connector 165 provides additional structural support to prevent breaking terminal 156 when plug 160 is inserted into and installed in port 150.

Ribs 166 can provide additional structure to facilitate friction fit securement between plug 160 and port 150. Furthermore, ribs 166 can be of a material that insulates a cable 168 of plug 160 to prevent electricity and/or electrical currents from escaping plug 160. Although not shown in the figures, it is further contemplated that in some embodiments, ribs 166 and/or port ribs 153 can be constructed so that ribs 166 can abut port ribs 153 for additional support and reduction of movement of plug 160 when installed in port 150. Additionally, ribs 166 can provide a seal (e.g., via friction fit securement) around plug 160, such that when plug 160 is installed in port 150, ribs 166 prevent dirt, grime, liquid, and other material from entering port 150. Ribs 166 can be constructed of silicone or other plastics to achieve the seal.

Insulator 167 is operable to insulate cable 168 and receive terminal 156. Furthermore, insulator 167 provides additional structural support to prevent breaking terminal 156 when plug 160 is inserted into and installed in port 150. Insulator 167 can be an overmolded cable seal that protects and seals cable 168 from dirt, grime, liquid, and other material from reaching cable 168.

Terminals 156 are configured to extend through first surface 120 to provide electricity and/or electrical currents from circuit board 210 through terminals 156 to plug 160. As shown, terminals 156 can be configured to communicate with cable 168 of plug 160 to allow communication of electricity and/or electrical currents.

Having described elements of circuit board cover 110, the disclosure now turns to benefits, functions, and use or installation of circuit board cover 110. Circuit board cover 110 is operable to provide insulation and protect circuit board 210. More specifically, circuit board cover 110 can protect circuit board 210 from dirt, gravel, water, and other elements or debris. For example, circuit board cover 110 can create house circuit board 210 and provide a seal (e.g., a friction fit, watertight seal between lower abutment surface 138 and a portion of a vehicle 100). Additionally, circuit board cover 110 insulates circuit board 210 by routing electricity and/or electrical currents through terminals 156. Similarly, circuit board cover 110 can prevent leakage of electricity and/or electrical currents by being composed of a non-conductive material (e.g., plastic).

Circuit board cover 110 can be installed onto a portion of a vehicle. For example, circuit board cover 110 can mount onto a trailer of a vehicle, a bumper, a trunk, etc. Circuit board cover 110 can first house circuit board 210 therein. More specifically, circuit board 210 can be disposed inside of circuit board cover 110, such that components 212 of circuit board cover 210 can be in communication with terminals 156 of circuit board cover 110. Circuit board cover 110 can then be secured onto the vehicle (e.g., by fastening mounting flaps 134 onto a mounting portion of vehicle 100 with fasteners 102). Circuit board cover 110 can then receive, via ports 150, plug 160 for a light and/or a set of lights.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A circuit board cover comprising:
   a housing having a first surface, a perimeter edge of the first surface, and a housing cavity partially defined by the first surface and the perimeter edge;
   a skirt extending from the perimeter edge between the first surface and a lower abutment surface to at least partially define the housing cavity, the lower abutment surface operable to form a watertight seal with a portion of a vehicle body, the housing cavity operable to house a printed circuit board; and
   a plurality of ports disposed on the first surface, each of the plurality of ports including (i) a sidewall extending away from the first surface in a second direction opposite to the first direction, (ii) a port cavity partially defined by the sidewall, and (iii) one or more terminals disposed at least partially within the port cavity.

2. The circuit board cover of claim 1,
   wherein,
   the first surface includes a first section and a second section,
   the first section includes a first subset of the plurality of ports configured to receive a plug for a main set of lights, and
   the second section includes a second subset of the plurality of ports configured to receive a second plug for a second set of lights.

3. The circuit board cover of claim 1, wherein the one or more terminals are molded into the circuit board cover and configured to provide an electrical connection with the printed circuit board.

4. The circuit board cover of claim 3,
   wherein, the printed circuit board is mounted within the housing cavity and configured to receive electricity via a vehicle power source and route the electricity via the electrical connection provided by the one or more terminals through the port cavity.

5. The circuit board cover of claim 4, further comprising:
a plug releasably secured to at least one of the plurality of ports,
wherein the electricity is communicated through the electrical connection to the plug.

6. The circuit board cover of claim 1, further comprising:
indicia disposed on the skirt for designating a first subset of the plurality of ports for a first use and a second subset of the plurality of ports for a second use.

7. The circuit board cover of claim 1, further comprising:
a plurality of mounting flaps protruding from the skirt in a third direction, each of the plurality of mounting flaps including a receiving aperture operable to receive a fastener and enable securing of the circuit board cover to the vehicle body, wherein the third direction is orthogonal to the first direction and the second direction.

8. The circuit board cover of claim 1, wherein the first surface comprises a first half and a second half, and wherein a first subset of the plurality of ports are disposed on the first half and a second subset of the plurality of ports are disposed the second half, and wherein the first subset and the second subset are different ports.

9. A circuit board protector comprising:
a housing having a first surface, a perimeter edge of the first surface, and a housing cavity partially defined by the first surface and the perimeter edge;
a skirt extending from the perimeter edge between the first surface and a lower abutment surface to at least partially define the housing cavity, the lower abutment surface operable to form a watertight seal with a portion of a vehicle body, the housing cavity operable to house a printed circuit board; and
a plurality of ports disposed on the first surface, each of the plurality of ports including (i) a sidewall extending away from the first surface in a second direction opposite to the first direction, (ii) a port cavity partially defined by the sidewall, and (iii) one or more terminals disposed at least partially within the port cavity.

10. The circuit board protector of claim 9,
wherein,
the first surface includes a first section and a second section,
the first section includes a first subset of the plurality of ports configured to receive a plug for a main set of lights, and
the second section includes a second subset of the plurality of ports configured to receive a second plug for a second set of lights.

11. The circuit board protector of claim 9, wherein the one or more terminals are molded into the circuit board protector and configured to provide an electrical connection with the printed circuit board.

12. A circuit board protector comprising:
a housing having a first surface, a perimeter edge of the first surface, and a housing cavity partially defined by the first surface and the perimeter edge;
a skirt extending from the perimeter edge between the first surface and a lower abutment surface to at least partially define the housing cavity, the lower abutment surface operable to form a watertight seal with a portion of a vehicle body, the housing cavity operable to house a printed circuit board; and
a plurality of ports disposed on the first surface, each of the plurality of ports including (i) a sidewall extending away from the first surface in a second direction opposite to the first direction, (ii) a port cavity partially defined by the sidewall, and (iii) one or more terminals disposed at least partially within the port cavity,
wherein,
the printed circuit board is mounted within the housing cavity and configured to receive electricity via a vehicle power source and route the electricity via the electrical connection provided by the one or more terminals through the port cavity.

13. The circuit board protector of claim 12, further comprising:
a plug releasably secured to at least one of the plurality of ports,
wherein the electricity is communicated through the electrical connection to the plug.

14. The circuit board protector of claim 9, further comprising:
indicia disposed on the skirt for designating a first subset of the plurality of ports for a first use and a second subset of the plurality of ports for a second use.

15. The circuit board protector of claim 9, further comprising:
a plurality of mounting flaps protruding from the skirt in a third direction, each of the plurality of mounting flaps including a receiving aperture operable to receive a fastener and enable securing of the circuit board protector to the vehicle body, wherein the third direction is orthogonal to the first direction and the second direction.

16. The circuit board protector of claim 9, wherein the first surface comprises a first half and a second half, and wherein a first subset of the plurality of ports are disposed on the first half and a second subset of the plurality of ports are disposed the second half, and wherein the first subset and the second subset are different ports.

17. A breakout module comprising:
a housing having a first surface, a perimeter edge of the first surface, and a housing cavity partially defined by the first surface and the perimeter edge;
a skirt extending from the perimeter edge between the first and a lower abutment surface to at least partially define the housing cavity, the lower abutment surface operable to form a watertight seal with a portion of a vehicle body, the housing cavity operable to house a printed circuit board; and
a plurality of ports disposed on the first surface, each of the plurality of ports including (i) a sidewall extending away from the first surface in a second direction opposite to the first direction, (ii) a port cavity partially defined by the sidewall, and (iii) one or more terminals disposed at least partially within the port cavity.

18. The breakout module of claim 17,
wherein,
the first surface includes a first section and a second section,
the first section includes a first subset of the plurality of ports configured to receive a plug for a main set of lights, and
the second section includes a second subset of the plurality of ports configured to receive a second plug for a second set of lights.

19. The breakout module of claim 17, wherein the one or more terminals are molded into the breakout module and configured to provide an electrical connection with the printed circuit board.

20. The circuit board cover of claim 1, wherein,
    the first surface defines a first plane,
    the lower abutment surface defines a second plane, and
    the first plane extends parallel to and is spaced from the second plane.

* * * * *